(12) United States Patent
Huang

(10) Patent No.: US 8,729,884 B2
(45) Date of Patent: May 20, 2014

(54) VOLTAGE MEASURING CIRCUIT

(75) Inventor: Yong-Zhao Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 181 days.

(21) Appl. No.: 13/282,637

(22) Filed: Oct. 27, 2011

(65) Prior Publication Data

US 2012/0274312 A1 Nov. 1, 2012

(30) Foreign Application Priority Data

Apr. 28, 2011 (CN) .......................... 2011 1 0107895

(51) Int. Cl.
*G01R 17/02* (2006.01)
(52) U.S. Cl.
USPC .............. 324/98; 324/76.11; 361/86; 361/90; 361/91.5
(58) Field of Classification Search
USPC .......................................... 324/96, 98, 76.11
See application file for complete search history.

(56) References Cited

U.S. PATENT DOCUMENTS

| 4,371,909 | A | * | 2/1983 | Kano | 361/91.8 |
| 4,464,622 | A | * | 8/1984 | Franklin | 324/67 |
| 4,797,608 | A | * | 1/1989 | White | 324/96 |
| 5,500,783 | A | * | 3/1996 | Warda et al. | 361/179 |
| 5,705,914 | A | * | 1/1998 | Morita | 340/636.17 |
| 2010/0321844 | A1 | * | 12/2010 | Landwehr | 361/86 |
| 2011/0050203 | A1 | * | 3/2011 | Huang | 324/76.11 |
| 2011/0235220 | A1 | * | 9/2011 | Huang | 361/18 |

OTHER PUBLICATIONS

Programmable Precision References TL431, A, B Series, 1998 Motorola Inc., Rev 6.*

* cited by examiner

*Primary Examiner* — Huy Q Phan
*Assistant Examiner* — Dustin Dickinson
(74) *Attorney, Agent, or Firm* — Novak Druce Connolly Bove + Quigg LLP

(57) ABSTRACT

A voltage measuring circuit includes a voltage measuring port, a voltage reference unit, a first voltage comparing unit and a light emitting diode. The voltage measuring port is for receiving an external voltage to be measured. The voltage reference unit includes a port providing a reference voltage. The first voltage comparing unit includes a reference port connected to the voltage reference unit, a measuring port connected to the voltage measuring port, and an output port for outputting a high/low level voltage when the external voltage is lower/higher than the reference voltage. The light emitting diode includes a cathode connected to the output port of the first voltage comparing unit and an anode connected to an external voltage port.

9 Claims, 3 Drawing Sheets

VOLTAGE MEASURING CIRCUIT

BACKGROUND

1. Technical Field

The present disclosure generally relates to voltage measuring circuits, and particularly to a voltage measuring circuit capable of determining a range of provided voltage.

2. Description of Related Art

As living standards improve, more and more electronic devices are used in daily life. A stable voltage is important to guarantee normal operation of an electronic device. Therefore, voltage detection is an important component in the electronic device design.

Therefore, there is room for improvement in the art.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the disclosure.

DETAILED DESCRIPTION

Figure 1:
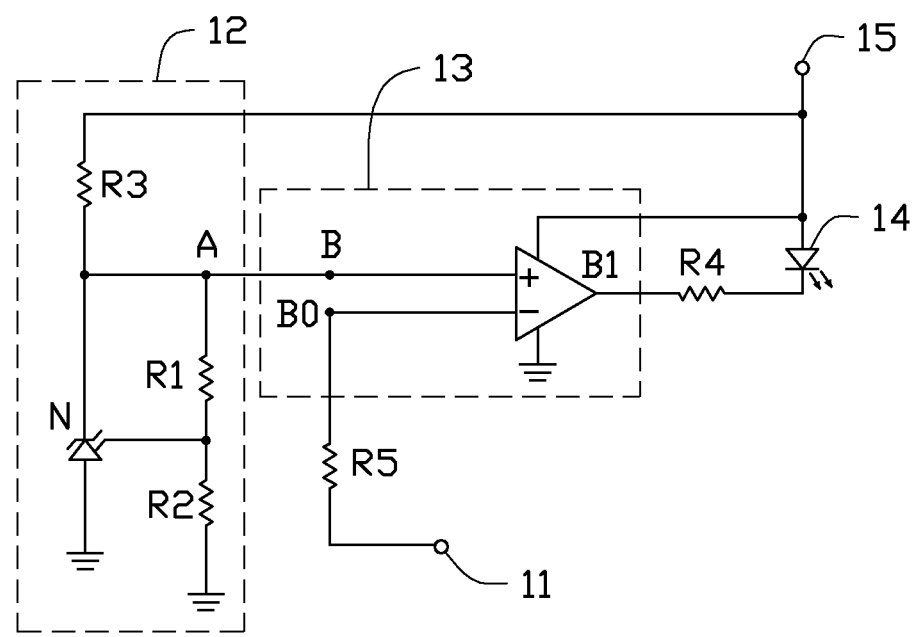
FIG. 1 is a circuit diagram of a voltage measuring circuit in accordance with a first embodiment of the present disclosure.

Reference will now be made to the drawing to describe the present voltage measuring circuit, in detail.

Referring to FIG. 1, a voltage measuring circuit 10 according to a first exemplary embodiment includes a voltage measuring port 11, a voltage reference unit 12, a voltage comparing unit 13, and a light emitting diode (LED) 14.

The voltage measuring port 11 is a node for receiving an external provided voltage Vin which is to be measured.

The voltage reference unit 12 includes a node A as an output port for outputting a reference voltage $V_A$. In this embodiment, the voltage reference unit 12 includes a three-terminal voltage regulating reference source N, a resistor R1, a resistor R2, and a resistor R3.

The three-terminal voltage regulating reference source N includes an anode, a cathode, and a reference terminal. The anode of the three-terminal voltage regulating reference source N is connected to ground. The cathode of the three-terminal voltage regulating reference source N is connected to an external voltage port 15 by the resistor R3. The reference terminal is for providing a constant reference voltage $V_{ref}$.

The resistor R1 is connected between the reference terminal and the cathode of the three-terminal voltage regulating reference source N. The resistor R2 is connected between the reference terminal of the three-terminal voltage regulating reference and ground. The resistors R1 and R2 perform a voltage dividing function, and a voltage $V_A$ of the node A satisfies:

$$V_A = \left(1 + \frac{R1}{R2}\right) V_{ref}.$$

Therefore, a desired value of the voltage $V_A$ can be obtained by adjusting resistance ratio of the resistors R1 and R2. In this embodiment, the voltage reference unit 12 further includes a current limiting resistor R3 connected between the cathode of the three-terminal voltage regulating reference source N and the external voltage port 15. The reference source N can be a TL431 voltage regulator.

The voltage comparing unit 13 is for comparing the voltage Vin with the reference voltage $V_A$. The voltage comparing unit 13 includes nodes B, B0 and B1. The node B is connected to the node A of the voltage reference unit 12, thereby acting as a reference port for receiving the reference voltage $V_A$. A voltage $V_B$ of the node B satisfies: $V_B = V_A$. The node $B_0$ is connected to the voltage measuring port 11, thereby acting as a measuring port for receiving the voltage Vin to be measured. Preferably, the node $B_0$ is connected to the voltage measuring port 11 by a resistor R5. The node $B_1$ acts as an output port for outputting a high/low level voltage when the voltage Vin is lower/higher than the reference voltage $V_A$.

In this embodiment, the voltage comparing unit 13 includes a voltage comparator with a non-inverting terminal, an inverting terminal, a power terminal, a ground terminal and an output terminal. The non-inverting terminal of the voltage comparator is connected to the node B. The inverting terminal of the voltage comparator is connected to the node $B_0$. The output terminal of the voltage comparator is connected to the node $B_1$. The power terminal of the voltage comparator is connected to the external voltage port 15. The ground terminal of the voltage comparator is connected to ground.

The LED 14 includes a cathode connected to the node $B_1$ of the voltage comparing unit 13 and an anode connected to the external voltage port 15. In this embodiment, the cathode of the LED 14 is connected to the node $B_1$ through a resistor R4.

In case of that the voltage Vin satisfies Vin>$V_B$, the output port of the voltage comparing unit 13 provides a low level voltage to the cathode of the LED 14, thereby the LED 14 is on.

In case of that the voltage Vin satisfies Vin<$V_B$, the output port of the voltage comparing unit 13 provides a high level voltage to the cathode of the LED 14, thereby the LED 14 is off.

As such, a range of the voltage Vin can be concluded according to following rules:

(a). if the LED 14 is on, Vin>$V_B$,
(b). if the LED 14 is off, Vin<$V_B$.

Accordingly, a range of the voltage Vin can be determined according to whether or not the LED 14 emit light.

Figure 2:
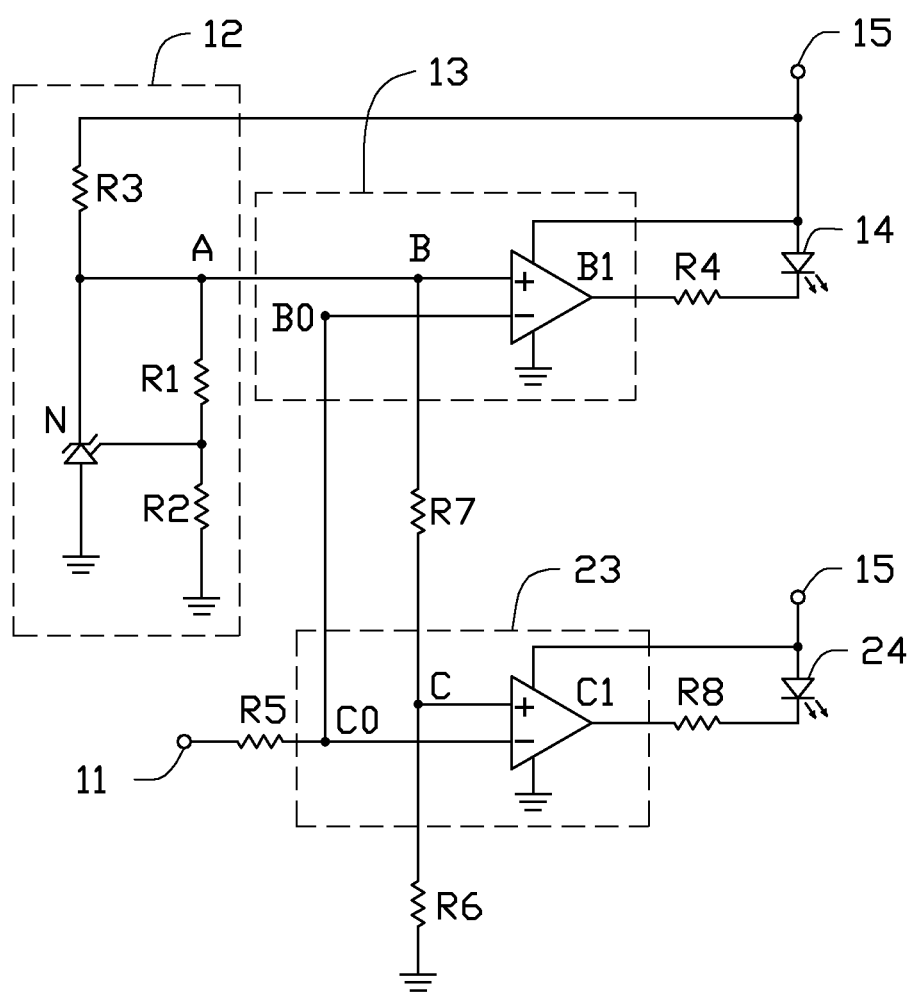
FIG. 2 is a circuit diagram of a voltage measuring circuit in accordance with a second embodiment of the present disclosure.

Referring to FIG. 2, a voltage measuring circuit 20 according to a second exemplary embodiment is provided. Similar to the voltage measuring circuit 10, the voltage measuring circuit 20 also includes a voltage measuring port 11, a voltage reference unit 12, a voltage comparing unit 13 and an LED 14. One difference though, is that the voltage measuring circuit 20 further includes a voltage comparing unit 23 and an LED 24.

The voltage comparing unit 23 includes nodes C, $C_0$ and $C_1$. The node C acts as a reference port for receiving a reference voltage $V_C$. The node $C_0$ acts as a measuring port for receiving the voltage Vin to be measured. In this embodiment, the node $C_0$ is connected to the voltage measuring port 11 by the resistor R5. The node $C_1$ acts as an output port for outputting a high/low level voltage when the voltage Vin is lower/higher than the reference voltage $V_C$. The node C is connected to ground by a resistor R6, and connected to the node A by a resistor R7. As such, a reference voltage $V_C$ at the node C satisfies:

$$V_C = \left(\frac{R6}{R6 + R7}\right)V_A, \quad V_C < V_A = V_B.$$

In this embodiment, the voltage comparing unit 23 includes a voltage comparator with a non-inverting terminal, an inverting terminal, a power terminal, ground terminal and an output terminal. The non-inverting terminal of the voltage comparator is connected to the node C. The inverting terminal of the voltage comparator is connected to the node $C_0$. The output terminal of the voltage comparator is connected to the node $C_1$. The power terminal of the voltage comparator of the voltage comparing unit 23 is connected to the external voltage port 15. The ground terminal of the voltage comparator of the voltage comparing unit 23 is connected to ground.

The LED 24 includes a cathode connected to the node $C_1$ of the voltage comparing unit 23 and an anode connected to the external voltage port 15. In this embodiment, the cathode of the LED 24 is connected to the node $C_1$ by a resistor R8.

In the case that the voltage Vin satisfies Vin>$V_B$>$V_C$, the output port of the voltage comparing unit 13 (i.e. the node $B_1$) provides a low voltage to the cathode of the LED 14, and the output port of the voltage comparing unit 23 (i.e. the node $C_1$) provides a low voltage to the cathode of the LED 24. Accordingly, the LEDs 14, 24 are both on.

In the case that the voltage Vin satisfies $V_B$>Vin>$V_C$, the output port of the voltage comparing unit 13 (i.e. the node $B_1$) provides a high voltage to the cathode of the LED 14, and the output port of the voltage comparing unit 23 (i.e. the node $C_1$) provides a low voltage to the cathode of the LED 24. Accordingly, the LED 14 is off and the LED 24 is on.

In the case that the voltage Vin satisfies Vin>$V_B$>$V_C$, the output port of the voltage comparing unit 13 (i.e. the node $B_1$) provides a high voltage to the cathode of the LED 14, and the output port of the voltage comparing unit 23 (i.e. the node $C_1$) provides a high voltage to the cathode of the LED 24. Accordingly, the LEDs 14, 24 are both off.

As such, a range of the voltage Vin can be determined according to following rules:
  (a). if the LEDs 14, 24 are both on, Vin>$V_B$>$V_C$,
  (b). if the LED 14 is off and the LED 24 is on, $V_B$>Vin>$V_C$,
  (c). if the LEDs 14, 24 are both off, $V_B$>$V_C$>Vin.

Figure 3:
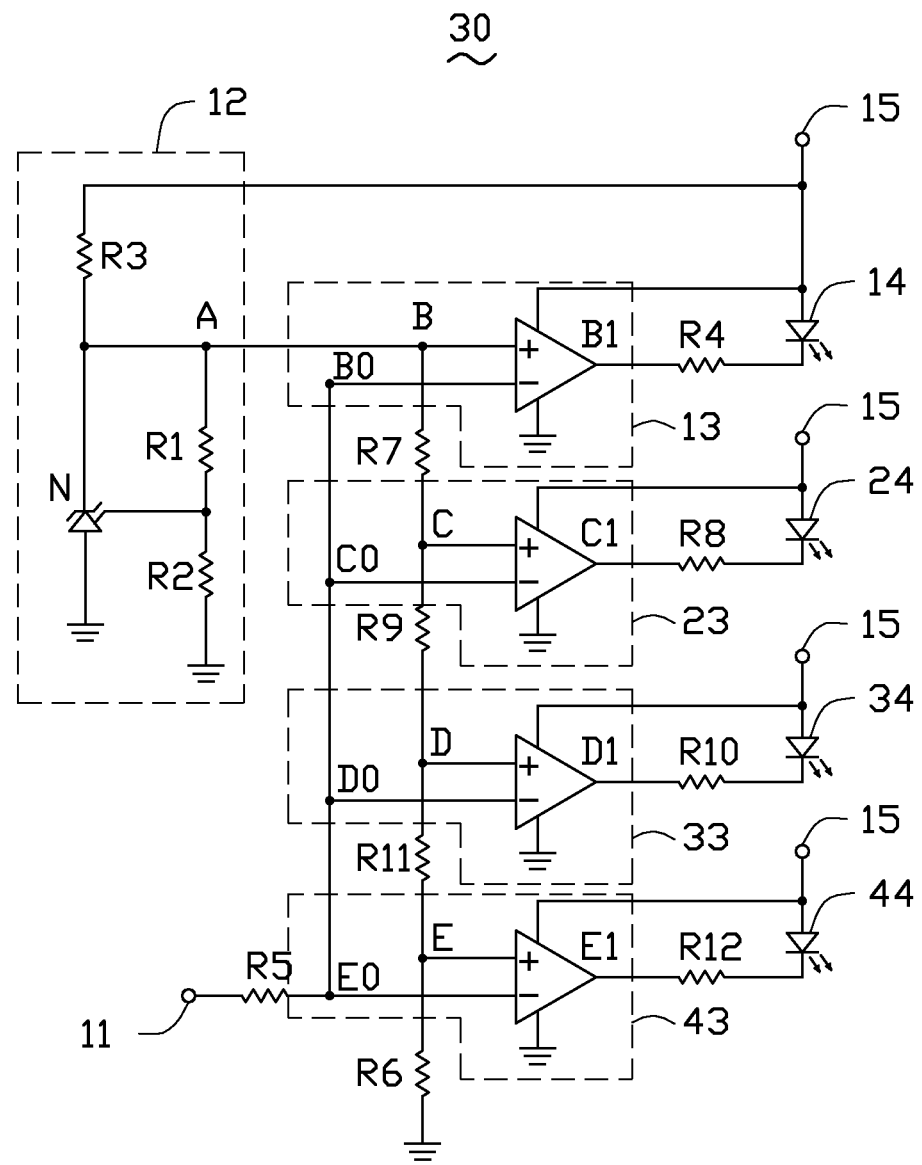
FIG. 3 is a circuit diagram of a voltage measuring circuit in accordance with a third embodiment of the present disclosure.

Referring to FIG. 3, a voltage measuring circuit 30 according to a third exemplary embodiment is provided. Similar to the voltage measuring circuit 20, the voltage measuring circuit 30 also includes a voltage measuring port 11 and a voltage reference unit 12. What is different from the voltage measuring circuit 20 is that, the voltage measuring circuit 30 includes four voltage comparing units 13, 23, 33, 43 and four LEDs 14, 24, 34, 44.

The voltage comparing unit 23 includes nodes C, $C_0$ and $C_1$. The node C acts as a reference port for receiving a reference voltage $V_C$. The node $C_0$ acts as a measuring port for receiving the voltage Vin to be measured. Preferably, the node $C_0$ is connected to the voltage measuring port 11 by the resistor R5. The node $C_1$ acts as an output port for outputting a high/low level voltage when the voltage Vin is lower/higher than the reference voltage $V_C$. The node C is connected to the node A by a resistor R7.

In this embodiment, the voltage comparing unit 23 includes a voltage comparator with a non-inverting terminal, an inverting terminal, a power terminal, ground terminal and an output terminal. The non-inverting terminal of the voltage comparator is connected to the node C. The inverting terminal of the voltage comparator is connected to the node $C_0$. The output terminal of the voltage comparator is connected to the node $C_1$. The power terminal of the voltage comparator of the voltage comparing unit 23 is connected to the external voltage port 15. The ground terminal of the voltage comparator of the voltage comparing unit 23 is connected to ground.

The LED 24 includes a cathode connected to the node $C_1$ of the voltage comparing unit 23 and an anode connected to the external voltage port 15. Preferably, the cathode of the LED 24 is connected to the node $C_1$ by a resistor R8.

The voltage comparing unit 33 includes nodes D, $D_0$ and $D_1$. The node D acts as a reference port for receiving a reference voltage $V_D$. The node $D_0$ acts as a measuring port for receiving the voltage Vin to be measured. Preferably, the node $D_0$ is connected to the voltage measuring port 11 by the resistor R5. The node $D_1$ acts as an output port for outputting a high/low level voltage when the voltage Vin is lower/higher than the reference voltage $V_D$. The node D is connected to the node C by a resistor R9.

In this embodiment, the voltage comparing unit 33 includes a voltage comparator with a non-inverting terminal, an inverting terminal, a power terminal, ground terminal and an output terminal. The non-inverting terminal of the voltage comparator is connected to the node D. The inverting terminal of the voltage comparator is connected to the node $D_0$. The output terminal of the voltage comparator is connected to the node $D_1$. The power terminal of the voltage comparator of the voltage comparing unit 33 is connected to the external voltage port 15. The ground terminal of the voltage comparator of the voltage comparing unit 33 is connected to ground.

The LED 34 includes a cathode connected to the node $D_1$ of the voltage comparing unit 33 and an anode connected to the external voltage port 15. In this embodiment, the cathode of the LED 34 is connected to the node $D_1$ by a resistor R10.

The voltage comparing unit 43 includes nodes E, $E_0$ and $E_1$. The node E acts as a reference port for receiving a reference voltage $V_E$. The node $E_0$ acts as a measuring port for receiving the voltage Vin to be measured. In this embodiment, the node $E_0$ is connected to the voltage measuring port 11 by the resistor R5. The node $E_1$ acts as an output port for outputting a high/low level voltage when the voltage Vin is lower/higher than the reference voltage $V_E$. The node E is connected to ground by a resistor R6, and connected to the node D by a resistor R11.

In this embodiment, the voltage comparing unit 43 includes a voltage comparator with a non-inverting terminal, an inverting terminal, a power terminal, ground terminal and an output terminal. The non-inverting terminal of the voltage comparator is connected to the node E. The inverting terminal of the voltage comparator is connected to the node $E_0$. The output terminal of the voltage comparator is connected to the node $E_1$. The power terminal of the voltage comparator of the voltage comparing unit 43 is connected to the external voltage port 15. The ground terminal of the voltage comparator of the voltage comparing unit 43 is connected to ground.

The LED 44 includes a cathode connected to the node $E_1$ of the voltage comparing unit 43 and an anode connected to the external voltage port 15. Preferably, the cathode of the LED 44 is connected to the node $E_1$ by a resistor R12.

The reference voltage $V_B$, $V_C$, $V_D$, $V_E$ satisfies:

$$V_B = V_A,$$

$$V_C = \left(\frac{R6 + R9 + R11}{R6 + R7 + R9 + R11}\right)V_B;$$

$$V_D = \left(\frac{R6 + R11}{R6 + R7 + R9 + R11}\right)V_B = \left(\frac{R6 + R11}{R6 + R9 + R11}\right)V_C;$$

-continued $$V_E = \left(\frac{R6}{R6+R7+R9+R11}\right)V_B = \left(\frac{R6}{R6+R9+R11}\right)V_C = \left(\frac{R6}{R6+R11}\right)V_D;$$

$$V_A = V_B > V_C > V_D > V_E.$$

Similar to the second embodiment, a range of the voltage Vin can be concluded according to following rules:

(a). if the LEDs 14, 24, 34, 44 are all on, then Vin>$V_B$>$V_C$>$V_D$>$V_E$;
(b). if the LED 14 is off and the LEDs 24, 34, 44 are on, then $V_B$>Vin>$V_C$>$V_D$>$V_E$;
(c). if the LEDs 14, 24 are off and the LEDs 34, 44 are on, then $V_B$>$V_C$>Vin>$V_D$>$V_E$;
(d). if the LEDs 14, 24, 34 are off and the LED 44 is on, then $V_B$>$V_C$>$V_D$>Vin>$V_E$;
(e). if the LEDs 14, 24, 34, 44 are all off, then $V_B$>$V_C$>$V_D$>$V_E$>Vin.

It is to be noted that, the voltage measuring circuit can be equipped with three, five or more voltage comparing units. Further, the reference source N is not limited to be a TL431 voltage regulator, but can also be some other type of voltage regulator capable of providing a suitable adjustable reference voltage.

It is to be understood that the above-described embodiments are intended to illustrate rather than limit the disclosure. Variations may be made to the embodiments without departing from the spirit of the disclosure as claimed. The above-described embodiments illustrate the range of the disclosure but do not restrict the range of the disclosure.

What is claimed is:

1. A voltage measuring circuit comprising:
    a voltage measuring port for receiving an external voltage to be measured;
    a voltage reference unit with a port providing a reference voltage;
    a first voltage comparing unit with a reference port connected to the voltage reference unit, a measuring port connected to the voltage measuring port, and an output port, the voltage reference unit being connected between an external voltage port and the first voltage comparing unit, the output port outputting a high level voltage when the external voltage is lower than the reference voltage, the output port outputting a low level voltage when the external voltage is higher than the reference voltage;
    a first light emitting diode with a cathode connected to the output port of the first voltage comparing unit and an anode connected to the external voltage port;
    a second voltage comparing unit with a reference port connected to ground and the voltage reference unit respectively by a fourth resistor and a fifth resistor, a measuring port connected to the voltage measuring port, and an output port for outputting a high level voltage when the external voltage is lower than the voltage of the reference port of the second voltage comparing unit, the output port outputting a low level voltage when the external voltage is higher than the voltage of the reference port of the second voltage comparing unit; and
    a second light emitting diode with a cathode connected to the output port of the second voltage comparing unit and an anode connected to the external voltage port.

2. The voltage measuring circuit according to claim 1, wherein the voltage reference unit comprises:
    a three-terminal voltage regulating reference source with an anode connected to ground, a cathode connected to the external voltage port and a reference terminal;
    a first resistor being connected between the reference terminal of the three-terminal voltage regulating reference and the cathode of the three-terminal voltage regulating reference; and
    a second resistor being connected between the reference terminal of the three-terminal voltage regulating reference and ground.

3. The voltage measuring circuit according to claim 2, wherein the cathode of the three-terminal voltage regulating reference is connected to the external voltage port by a third resistor.

4. The voltage measuring circuit according to claim 2, wherein the three-terminal voltage regulating reference source is a TL431 voltage regulator.

5. The voltage measuring circuit according to claim 1, wherein the first voltage comparing unit comprises a first voltage comparator with a non-inverting terminal acting as the reference port of the first voltage comparing unit, an inverting terminal acting as the measuring port of the first voltage comparing unit, a power terminal connected to the external voltage port, a ground terminal connected to ground, and an output terminal acting as the output port of the first voltage comparing unit.

6. The voltage measuring circuit according to claim 1, wherein the cathode of the first light emitting diode is connected to the output port of the first voltage comparing unit by a current limiting resistor.

7. The voltage measuring circuit according to claim 1, wherein the second voltage comparing unit comprises a second voltage comparator with a non-inverting terminal acting as the reference port of the second voltage comparing unit, an inverting terminal acting as the measuring port of the second voltage comparing unit, a power terminal connected to the external voltage port, a ground terminal connected to ground, and an output terminal acting as the output port of the second voltage comparing unit.

8. The voltage measuring circuit according to claim 1, wherein the cathode of the second light emitting diode is connected to the output port of the second voltage comparing unit by a current limiting resistor.

9. A voltage measuring circuit comprising:
    a voltage measuring port for receiving an external voltage to be measured;
    a voltage reference unit with a port providing a reference voltage;
    first through Nth voltage comparing units and first through Nth LEDs, where N is an integer of at least 2;
    the first voltage comparing unit comprising a first reference port connected to the voltage reference unit, a first measuring port connected to the voltage measuring port, and a first output port, the voltage reference unit being connected between an external voltage port and the first voltage comparing unit, the first output port outputting a high level voltage when the external voltage is lower than the reference voltage, the first output port outputting a low level voltage when the external voltage is higher than the reference voltage;
    the nth voltage comparing unit, where n=2, 3, ..., N−1, comprising an nth reference port connected to the (n−1)th reference port by a (n−1)th resistor, an nth measuring port connected to the voltage measuring port, and an nth output port for outputting a high level voltage when the external voltage is lower than the voltage of the nth reference port, the nth output port outputting a low level voltage when the external voltage is higher than the voltage of the nth reference port;

the Nth voltage comparing unit comprising an Nth reference port connected to the (N−1)th reference port by a (N−1)th resistor, an Nth measuring port connected to the voltage measuring port, and a Nth output port for outputting a high level voltage when the external voltage is lower than the voltage of the Nth reference port, the Nth output port outputting a low level voltage when the external voltage is higher than the voltage of the Nth reference port;

the first through Nth light emitting diode comprising anodes connected to the external voltage port, and cathodes connected to the output ports of the first through Nth voltage comparing units, respectively.

* * * * *